(12) United States Patent
Peck

(10) Patent No.: US 12,369,260 B2
(45) Date of Patent: Jul. 22, 2025

(54) PRINTED CIRCUIT BOARD ASSEMBLY

(71) Applicant: Vitesco Technologies GmbH, Regensburg (DE)

(72) Inventor: Stefan Peck, Munich (DE)

(73) Assignee: Vitesco Technologies GmbH, Regensburg (DE)

( * ) Notice: Subject to any disclaimer, the term of this patent is extended or adjusted under 35 U.S.C. 154(b) by 170 days.

(21) Appl. No.: 17/910,429

(22) PCT Filed: Mar. 4, 2021

(86) PCT No.: PCT/EP2021/055421
§ 371 (c)(1),
(2) Date: Sep. 9, 2022

(87) PCT Pub. No.: WO2021/180552
PCT Pub. Date: Sep. 16, 2021

(65) Prior Publication Data
US 2023/0134163 A1    May 4, 2023

(30) Foreign Application Priority Data
Mar. 11, 2020  (DE) .................. 10 2020 203 145.2

(51) Int. Cl.
*H05K 3/00*    (2006.01)
*H05K 1/02*    (2006.01)
*H05K 1/05*    (2006.01)
*H05K 1/18*    (2006.01)
*H05K 3/34*    (2006.01)

(52) U.S. Cl.
CPC ........... *H05K 3/341* (2013.01); *H05K 1/0296* (2013.01); *H05K 1/05* (2013.01); *H05K 1/181* (2013.01)

(58) Field of Classification Search
CPC ........ H05K 3/341; H05K 1/0296; H05K 1/05; H05K 1/181
See application file for complete search history.

(56) References Cited

U.S. PATENT DOCUMENTS

| | | |
|---|---|---|
| 10,546,800 B2 | 1/2020 | Hino et al. |
| 10,631,399 B2 | 4/2020 | Mayer-Dick |
| 11,335,633 B2 | 5/2022 | Kusano et al. |
| 2007/0035015 A1 | 2/2007 | Hsu |

(Continued)

FOREIGN PATENT DOCUMENTS

| | | |
|---|---|---|
| CN | 109803483 A | 5/2019 |
| DE | 102007051316 A1 | 4/2009 |

(Continued)

*Primary Examiner* — Pete T Lee
(74) *Attorney, Agent, or Firm* — Laurence A. Greenberg; Werner H. Stemer; Ralph E. Locher

(57) ABSTRACT

A circuit board assembly includes a circuit board having at least one conductive inner layer and at least one surface. Contact areas or surfaces and electrical and/or electronic components are disposed on the surface and electrically connected to the contact areas. At least two of the contact areas are connected to one another by an electrically conductive strip having ends each being connected to a respective one of the contact areas. The at least two contact areas and the electrically conductive strip have a width of at least 8 mm and the strip has a thickness that is at least double the thickness of the at least one inner layer.

3 Claims, 1 Drawing Sheet

(56) References Cited

U.S. PATENT DOCUMENTS

| | | | | |
|---|---|---|---|---|
| 2010/0258952 A1* | 10/2010 | Fjelstad | ................. | H01L 24/48 |
| | | | | 257/E23.06 |
| 2011/0096495 A1 | 4/2011 | Heise | | |
| 2013/0063902 A1* | 3/2013 | Yoshida | ............... | H05K 1/0209 |
| | | | | 361/728 |
| 2015/0114694 A1* | 4/2015 | Liu | ........................ | H05K 3/361 |
| | | | | 174/255 |
| 2015/0187731 A1* | 7/2015 | Kim | ................... | H01L 23/4985 |
| | | | | 257/738 |
| 2018/0263114 A1* | 9/2018 | Ogura | .................... | H05K 1/189 |
| 2019/0051587 A1* | 2/2019 | Azeroual | ............ | H01L 21/4857 |
| 2020/0374462 A1* | 11/2020 | Noguchi | .............. | H05K 7/1427 |

FOREIGN PATENT DOCUMENTS

| | | |
|---|---|---|
| DE | 102010042537 A1 | 4/2012 |
| DE | 102012204012 A1 | 9/2013 |
| DE | 102015202569 A1 | 8/2016 |
| DE | 102017217354 A1 | 9/2018 |
| DE | 102018210721 A1 | 5/2019 |
| WO | 2009144215 A1 | 12/2009 |
| WO | 2020012796 A1 | 1/2020 |

\* cited by examiner

PRINTED CIRCUIT BOARD ASSEMBLY

FIELD AND BACKGROUND OF THE INVENTION

The invention relates to a printed circuit board assembly having a printed circuit board that has at least one conductive inner layer and, on at least one surface, contact areas and electrical and/or electronic components that are electrically connected to the contact areas.

A printed circuit board assembly of this type is known from DE 10 2007 051 316 A1. The inner layers of these known printed circuit boards have a thickness of about 35 µm for the power supply and signal routing of conventional electronic components, and the insulating intermediate layers also have thicknesses that meet the insulation requirements of not excessively high voltages.

However, if use is made of power electronic components that have to switch voltages of 400 V to 800 V or higher at currents of several 100 A, the lines to and from these power electronic components must also be dimensioned accordingly. This means that both the electrically conductive inner layers and the insulating intermediate layers must be made to be significantly thicker. However, this makes the entire printed circuit board significantly thicker and also considerably more expensive.

SUMMARY OF THE INVENTION

It is therefore the object of the invention to find a solution for a printed circuit board assembly with high-voltage and/or high-current components.

The object is achieved by a printed circuit board assembly that is formed with a printed circuit board that has at least one conductive inner layer and, on at least one surface, contact areas and electrical and/or electronic components that are electrically connected to the contact areas, wherein, according to the invention, at least two of the contact areas are connected to one another via an electrically conductive strip, the ends of which are connected to each one of the contact areas, and wherein the at least two contact areas and the electrically conductive strip have a width of at least 8 mm and the strip has a thickness that is at least twice the thickness of the at least one inner layer.

Connections that have to carry large currents or to which high voltages are applied are therefore produced by means of additional, electrically conductive strips, for example metal strips. These strips are, for example, welded to the corresponding contact areas, which must be designed to be sufficiently large and thick. Conventional bonding techniques can be used for this.

These electrically conductive strips can be adapted very variably to the respective circumstances. They can therefore be selected according to the requirements in terms of their dimensions and in terms of the material used.

The invention is intended to be explained in more detail below on the basis of an exemplary embodiment with the aid of figures.

DETAILED DESCRIPTION OF THE INVENTION

Figure 1:
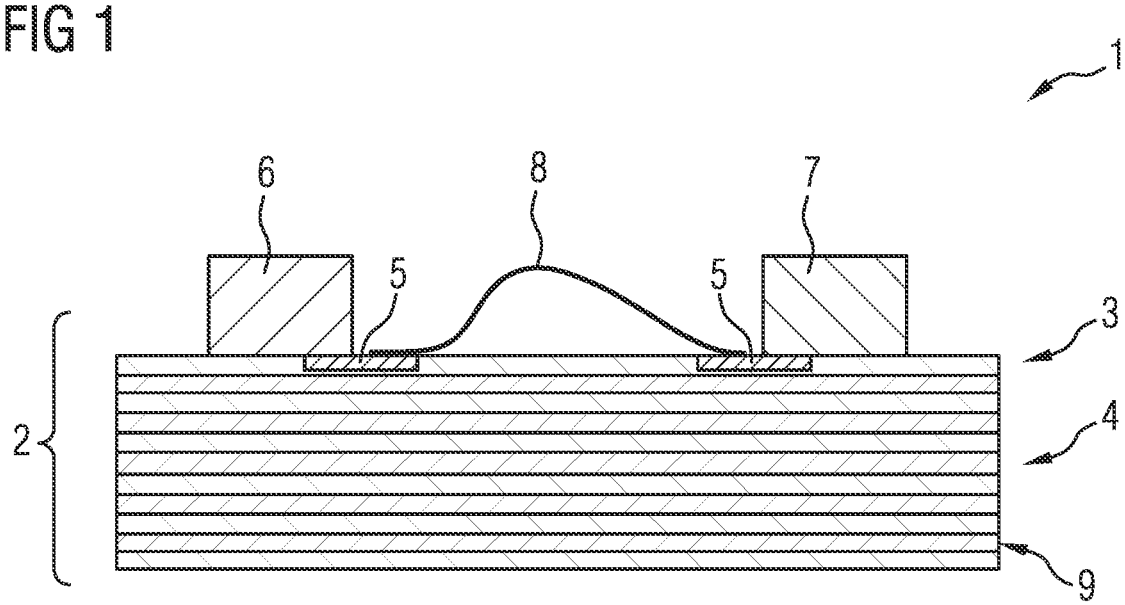
FIG. 1 shows a cross section through a printed circuit board assembly.
Figure 2:
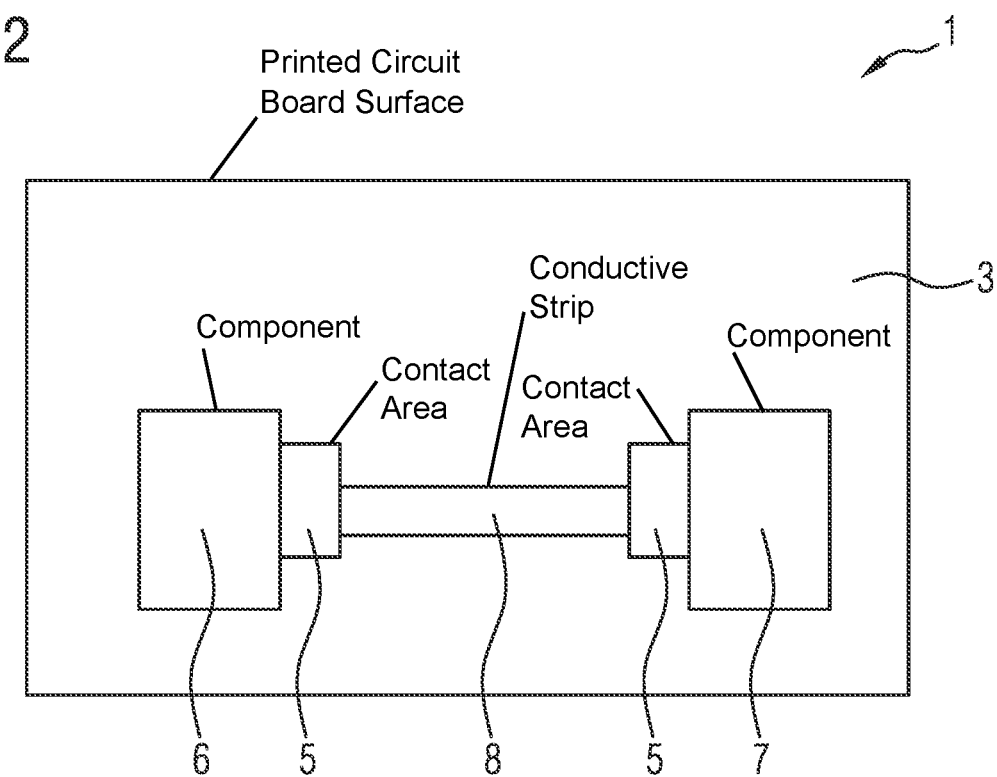
FIG. 2 shows a plan view of a printed circuit board assembly.

FIGS. 1 and 2 show a printed circuit board assembly 1 in a cross section and a plan view having a printed circuit board 2 that is formed from a sequence of at least partially conductive layers as inner layers 4 and insulating layers 9 arranged between the inner layers 4 and pressed to them. Such printed circuit boards are known, with the conductive and insulating layers usually having a thickness of about 35 µm.

In the exemplary embodiment shown, an insulating layer 9 is implemented on a surface 3 of the printed circuit board 2, in which contact areas 5 are embedded. The contact areas 5 can also protrude from the insulating layer 9 or be formed on it. They can be connected to other conductive structures by means of conductor tracks (not shown) also arranged on the surface 3 of the printed circuit board 2 formed as an insulating layer 9, or they can also be connected to inner, conductive layers (inner layers 4) by means of vias.

As examples, electrical or electronic components 6, 7 are arranged on the contact areas and are electrically connected to them in order to supply them with energy, for example. The components may be, for example, power semiconductors for switching high currents in the range of a few hundred amperes.

Since such high currents require conductors with correspondingly high cross-sections or thicknesses, the layer thicknesses of around 35 µm usually used for printed circuit boards are not sufficient; on the one hand, therefore, conductive layers would have to be realized with a greater thickness, but on the other hand, insulating layers would also have to be made correspondingly thicker. This would increase costs significantly.

For this reason, electrical connections that have to carry higher currents are implemented according to the invention with a conductive strip 8 that is at least 8 mm wide and has a thickness at least twice as thick as the thickness of the at least one inner layer 4. Such a printed circuit board assembly has the advantage that the electrically conductive connection between two contact areas 5 can be easily adapted to the respective requirements in terms of current carrying capacity, without the entire printed circuit board design having to be changed. Conventional printed circuit boards 2 can thus also continue to be used for large currents.

The invention claimed is:

1. A printed circuit board assembly, comprising:
   a printed circuit board having at least one conductive inner layer and at least one surface;
   contact areas disposed on said at least one surface;
   at least one of electrical or electronic components having a face mounted directly on said at least one surface, a portion of said face additionally directly mounted on a first portion of at least one of said contact areas, and electrically connected to said at least one of said contact areas;
   an electrically conductive strip interconnecting at least two of said contact areas, said electrically conductive strip having ends each being connected to a respective one of said at least two contact areas, one end of said electrically conductive strip being directly mounted to a second portion of said at least one of said contact areas extending on said at least one surface beyond the portion of said face directly mounted on said first portion;
   said at least two contact areas and said electrically conductive strip having a width of at least 8 mm; and said electrically conductive strip being at least twice as thick as said at least one inner layer.

2. The printed circuit board assembly according to claim 1, which further comprises a welded connection interconnecting said electrically conductive strip and one of said contact areas.

3. The printed circuit board assembly according to claim 1, wherein:
   said printed circuit board has insulating layers including an uppermost insulating layer at said at least one surface;
   said at least one conductive inner layer includes a plurality of conductive inner layers each being disposed between a respective two of said insulating layers;
   said contact areas are embedded within said uppermost insulating layer; and
   said at least one of electrical or electronic components are disposed on said uppermost insulating layer.

\* \* \* \* \*